(12) United States Patent
Todd

(10) Patent No.: US 6,716,713 B2
(45) Date of Patent: Apr. 6, 2004

(54) DOPANT PRECURSORS AND ION IMPLANTATION PROCESSES

(75) Inventor: Michael A. Todd, Phoenix, AZ (US)

(73) Assignee: Asm America, Inc., Phoenix, AZ (US)

(*) Notice: Subject to any disclaimer, the term of this patent is extended or adjusted under 35 U.S.C. 154(b) by 0 days.

(21) Appl. No.: 10/294,235

(22) Filed: Nov. 13, 2002

(65) Prior Publication Data

US 2003/0068851 A1 Apr. 10, 2003

Related U.S. Application Data

(62) Division of application No. 10/074,149, filed on Feb. 11, 2002.
(60) Provisional application No. 60/268,337, filed on Feb. 12, 2001, provisional application No. 60/279,256, filed on Mar. 27, 2001, provisional application No. 60/311,609, filed on Aug. 9, 2001, provisional application No. 60/323,649, filed on Sep. 19, 2001, provisional application No. 60/332,696, filed on Nov. 13, 2001, provisional application No. 60/333,724, filed on Nov. 28, 2001, and provisional application No. 60/340,454, filed on Dec. 7, 2001.

(51) Int. Cl.$^7$ ............................................. H01L 21/331
(52) U.S. Cl. ........................................ 438/369; 438/488
(58) Field of Search ................................. 438/255, 398, 438/482, 486, 488, 585, 680, 684, 369

(56) References Cited

U.S. PATENT DOCUMENTS

| | | | |
|---|---|---|---|
| 4,363,828 A | 12/1982 | Brodsky et al. | |
| 4,495,218 A | 1/1985 | Azuma et al. | |
| 4,585,671 A | 4/1986 | Kitagawa et al. | |
| 4,684,542 A | 8/1987 | Jasinski et al. | |
| 4,695,331 A | 9/1987 | Ramaprasad | |
| 5,084,355 A | * 1/1992 | Takahashi et al. | 428/457 |
| 5,227,329 A | 7/1993 | Kobayashi et al. | |
| 5,607,724 A | 3/1997 | Beinglass et al. | |
| 5,614,257 A | 3/1997 | Beinglass et al. | |
| 5,648,293 A | 7/1997 | Hayama et al. | |

(List continued on next page.)

FOREIGN PATENT DOCUMENTS

| | | |
|---|---|---|
| EP | 0 233 613 A2 | 2/1987 |
| GB | 1307036 A | 2/1973 |
| JP | 57209810 A | 12/1982 |
| JP | 59078918 A | 5/1984 |
| JP | 59078919 A | 5/1984 |
| JP | S60-43485 | 3/1985 |
| JP | 60043485 A | 3/1985 |
| JP | 61153277 A | 7/1986 |
| JP | 62076612 A | 4/1987 |
| JP | 63003414 A | 1/1988 |

(List continued on next page.)

OTHER PUBLICATIONS

Khanh, N.Q. et al., "Ion beam analysis of plasma immersion implanted silicon for solar cell fabrication," Nuclear Instruments and Methods in Physics Research, Sec. B, vol. 112, May 1, 1996, pp. 259–262.

Comfort, J.H. et al., "Plasma–enhanced chemical vapor deposition of in situ doped epitaxial silicon at low temperatures II boron doping," Journal of Applied Physics, vol. 65. No. 3, Feb. 1, 1989, pp. 1067–1073.

*Primary Examiner*—Dung A. Le
(74) *Attorney, Agent, or Firm*—Knobbe Martens Olson & Bear LLP

(57) ABSTRACT

Silicon alloys and doped silicon films are prepared by chemical vapor deposition and ion implantation processes using Si-containing chemical precursors as sources for Group III and Group V atoms. Preferred dopant precursors include $(H_3Si)_{3-x}MR_x$, $(H_3Si)_3N$, and $(H_3Si)_4N_2$, wherein R is H or D, x=0, 1 or 2, and M is selected from the group consisting of B, P, As, and Sb. Preferred deposition methods produce non-hydrogenated silicon alloy and doped Si-containing films, including crystalline films.

11 Claims, 1 Drawing Sheet

U.S. PATENT DOCUMENTS

| | | | |
|---|---|---|---|
| 5,656,531 A | 8/1997 | Thakur et al. | |
| 5,695,819 A | 12/1997 | Beinglass et al. | |
| 5,700,520 A | 12/1997 | Beinglass et al. | |
| 5,786,027 A | 7/1998 | Rolfson | |
| 5,789,030 A | 8/1998 | Rolfson | |
| 5,837,580 A | 11/1998 | Thakur et al. | |
| 5,874,129 A * | 2/1999 | Beinglass et al. | 427/248.1 |
| 5,876,797 A | 3/1999 | Beinglass et al. | |
| 5,885,869 A | 3/1999 | Turner et al. | |
| 6,027,705 A | 2/2000 | Kitsuno et al. | |
| 6,083,810 A | 7/2000 | Obeng et al. | |
| 6,159,828 A | 12/2000 | Ping et al. | 438/486 |
| 6,171,662 B1 | 1/2001 | Nakao | 427/595 |
| 6,197,669 B1 | 3/2001 | Twu et al. | 438/585 |
| 6,197,694 B1 | 3/2001 | Beinglass | |
| 2002/0098627 A1 * | 7/2002 | Pomarede et al. | 438/149 |

FOREIGN PATENT DOCUMENTS

| | | |
|---|---|---|
| JP | 63003463 A | 1/1988 |
| JP | 01217956 A | 8/1989 |
| JP | 01268064 A | 10/1989 |
| JP | 02155225 A | 6/1990 |
| JP | H 02-155225 | 6/1990 |
| JP | H3-91239 | 4/1991 |
| JP | 03091239 A | 4/1991 |
| JP | H3-185817 | 8/1991 |
| JP | 03185817 A | 8/1991 |
| JP | H3-187215 | 8/1991 |
| JP | 03187215 A | 8/1991 |
| JP | 03292741 A | 12/1991 |
| JP | 04323834 A | 11/1992 |
| JP | 05021378 A | 1/1993 |
| JP | H5-62911 | 3/1993 |
| JP | 05062911 A | 3/1993 |
| JP | 06302526 A | 10/1994 |
| JP | 07249618 A | 9/1995 |
| JP | 08242006 A | 9/1996 |
| JP | 08306688 | 11/1996 |

* cited by examiner

DOPANT PRECURSORS AND ION IMPLANTATION PROCESSES

RELATED APPLICATION INFORMATION

This application is a divisional of U.S. application Ser. No. 10/074,149, filed Feb. 11, 2002, which claims priority to U.S. Provisional Application No. 60/268,337, filed Feb. 12, 2001; U.S. Provisional Application No. 60/279,256, filed Mar. 27, 2001; U.S. Provisional Application No. 60/311,609, filed Aug. 9, 2001; U.S. Provisional Application No. 60/323,649, filed Sep. 19, 2001; U.S. Provisional Application No. 60/332,696, filed Nov. 13, 2001; U.S. Provisional Application No. 60/333,724, filed Nov. 28, 2001; and U.S. Provisional Application No. 60/340,454, filed Dec. 7, 2001. All of the foregoing patent applications are hereby incorporated by reference in their entireties. This application is related to, and incorporates by reference in their entireties, co-owned and co-pending U.S. patent application Ser. Nos. 10/074,563; 10/074,722; 10/074,633; 10/074,564; and 10/074,534, all of which were filed on Feb. 11, 2002. This application is also related to, and incorporates by reference in its entirety, U.S. patent application Ser. No. 10/294,233 flied Nov. 13, 2002, which is a continuation of U.S. application Ser. No. 10/074,149, filed Feb. 11, 2002.

BACKGROUND OF THE INVENTION

1. Field of the Invention

This invention relates generally to silicon-containing films useful in the semiconductor industry, and more particularly to processes for making doped silicon and silicon alloy films using silicon-containing chemical precursors as sources for compound or doped films.

2. Description of the Related Art

Silicon and silicon-containing materials (e.g., silicon germanium, silicon germanium carbon, silicon carbon alloys, silicon carbide, etc.) are widely used in semiconductor films in integrated circuits with electronic band gap energies that are a function of their specific elemental composition. By incorporating dopant elements, primarily derived from the Group III and Group V families of elements, these semiconductors can be transformed into p-type (electron deficient) and n-type (electron rich) semiconductors. These doped materials are the building blocks for a number of microcircuit devices e.g., transistors.

There are three primary processes by which silicon-containing ("Si-containing") materials are doped with electrically active atoms of the Group III and Group V families of elements: (1) ion implantation, (2) in situ doping during chemical vapor deposition, and (3) solid source diffusion. In ion implantation processes, a dopant precursor in a reaction chamber is fragmented to form a dopant ion and then mass-selected through the use of a magnetic field. These mass-selected species are then collimated into a beam of charged species with an incident energy determined by the extraction voltage of the process. Doping is accomplished by directing this beam onto the Si-containing material. Ion implantation of boron is typically accomplished using dopant precursors such as diborane ($B_2H_6$), boron trifluoride ($BF_3$), isotopically enhanced $^{11}B$ boron trifluoride and decaborane ($B_{10}H_{14}$). Typical dopant precursors for phosphorus and arsenic are phosphine ($PH_3$) and arsine ($AsH_3$), respectively.

In chemical vapor deposition (CVD) processes, the Si-containing material can be doped in situ by supplying the dopant precursor to the CVD chamber during the deposition of the Si-containing material. Typical dopant precursors for in situ doping of silicon-based materials include diborane, phosphine, and arsine.

In solid source diffusion applications, the atom(s) to be incorporated into the Si-containing material are either deposited in a relatively pure form on the surface of the material to be doped or are constituents of a heavily doped Si-containing film that is deposited on the surface of the material to be doped. The dopant atom(s) thus deposited are then diffused into the Si-containing material during a subsequent thermal anneal/drive process step. Typical dopant sources for the deposition of the dopant-containing overlayer include diborane, arsine, and phosphine. Examples of solid diffusion sources include heavily doped amorphous silicon and doped phosphorus-rich borophosphosilicate glass (BPSG).

The doping processes described above are employed widely within the industry for the manufacture of n-type and p-type silicon-based semiconductor materials. Each of these processes has limitations and drawbacks. For instance, the use of conventional dopant precursors often introduces unwanted elements. In the case of hydride dopant precursors, such as diborane and phosphine, various partially hydrogenated species formed during ion implantation create a "mass envelope" from which it is difficult to select the desired dopant species. This difficulty arises from the very small total mass of the fragments and the differences in mass between the various hydrogenated species (e.g., $PH_2^+$, $PH^+$, $P^+$, etc.), as well as the any overlap in mass between isotopes (e.g., boron has two stable isotopes with high natural abundancy, $^{11}B$ and $^{10}B$). The use of hydride dopant precursors for in situ CVD and diffusion source doping often has drawbacks, including: (1) poor dopant incorporation at low film deposition temperature (particularly for arsenic), (2) segregation of dopant atoms along grain boundaries in polycrystalline silicon-based materials, (3) decreased deposition rate of polycrystalline materials as the concentration of in situ dopant precursors is increased, particularly at low temperature, (4) low percentage of electrically active dopant species relative to the total concentration of dopant atoms present within the silicon-based material, particularly for low deposition temperature, requiring separate activation steps that consume thermal budget, (5) poor control over the distribution of the dopant atoms following subsequent thermal processing to drive the dopant and form a p-n junction arising from multiple diffusion pathways available due to the partially incorporated nature of the dopant atoms (i.e., dopant atoms are substitutionally incorporated within the crystalline framework of the silicon-based material as well as incorporated along grain boundaries and/or the surface of the film), and/or (6) limitations on the total concentration of electrically activated dopant atoms that can be incorporated within the silicon-based material as a function of solid solubility, particularly at low deposition temperature.

The n-type dopant precursors or sources commonly utilized include phosphine and arsine. In addition to the problems cited above for the use of hydride dopant sources, halide sources entail other difficulties such as contamination of the silicon-based material with halide elements, particularly at low deposition temperature, and/or difficulty in delivering the dopant source to the reactor chamber as a function of precursor volatility. Many halides are low volatility liquids that require the use of a bubbler to deliver the precursor. This can also introduce problems with repeatability.

U.S. Pat. No. 4,910,153 concerns the fabrication of negatively-doped hydrogenated amorphous silicon alloys at relatively low deposition temperatures. Such hydrogenated amorphous silicon alloys generally contain 10 atomic % or more of hydrogen, which is desirable for certain photosensor applications. See U.S. Pat. No. 4,491,626 (cited in background section of U.S. Pat. No. 4,910,153). The use of trisilylarsine and trisilylphosphine as dopants is disclosed in U.S. Pat. No. 4,910,153, but that patent does not address the problems discussed above which are encountered when doping non-hydrogenated Si-containing materials or when doping crystalline Si-containing materials, such as polysilicon and epitaxial silicon. U.S. Pat. No. 4,200,666 concerns the deposition of hydrogenated silicon nitride using trisilylamine, but does not disclose methods for making non-hydrogenated Si-containing materials.

Thus, a number of problems remain with respect to making Si-containing films such as silicon alloys and doped amorphous silicon, polysilicon, and epitaxial silicon.

SUMMARY OF THE INVENTION

The inventors have discovered that doped Si-containing films can be made using chemical precursors that comprise at least one silicon atom and at least one Group III or Group V atom. In accordance with one aspect of the invention, a deposition process is provided for making a non-hydrogenated Si-containing film, comprising:

providing a vapor deposition chamber having a substrate disposed therein, introducing a dopant precursor to the chamber, wherein the dopant precursor comprises at least one silicon atom and at least one Group III and/or Group V atom, and depositing a non-hydrogenated Si-containing film onto the substrate.

Another aspect of the invention provides a deposition process for making an at least partially crystalline Si-containing film, comprising:

providing a chemical vapor deposition chamber having a substrate disposed therein, introducing a silicon source and a dopant precursor to the chamber, wherein the dopant precursor is comprised of at least one silicon atom and at least one Group III and/or Group V atom, and depositing a doped Si-containing film onto the substrate.

Another aspect of the invention provides a chemical vapor deposition process for making a Si-containing film, comprising:

providing a chemical vapor deposition chamber having a substrate disposed therein, introducing a silicon source and a dopant precursor to the chamber, wherein the dopant precursor is comprised of at least one silicon atom and at least one Group III and/or Group V atom, depositing a doped amorphous Si-containing film onto the substrate, and heating the doped amorphous Si-containing film to a temperature in the range of about 550° C. to about 700° C. for a period of time effective to at least partially crystallize the doped amorphous Si-containing film.

Another aspect of the invention provides an ion implantation process for making a doped Si-containing film, comprising:

providing a Si-containing film on a substrate, providing an ionization chamber upstream of the substrate, introducing a dopant precursor to the ionization chamber, wherein the dopant precursor comprises at least one silicon atom and at least one Group III or Group V atom, ionizing at least a portion of the dopant precursor to form dopant excited species by applying electromagnetic energy to the dopant precursor, applying a magnetic field to the dopant excited species to create a sub-population of mass-selected dopant excited species, and directing at least a portion of the sub-population of mass-selected dopant excited species onto the Si-containing film to produce a doped Si-containing film.

Another aspect of the invention provides a method for making a doped Si-containing film, comprising:

providing a Si-containing film, forming a plasma from a gas comprising a dopant precursor selected from the group consisting of $(H_3Si)_{3-x}MR_x$, $(H_3Si)_3N$, and $(H_3Si)_4N_2$, wherein R is H or D, x=0, 1 or 2, and M is selected from the group consisting of B, P, As, and Sb; and implanting active species of the dopant precursor from the plasma into the Si-containing film by ion implantation.

These and other aspects of the invention will be understood in view of the preferred embodiments described in more detail below.

DETAILED DESCRIPTION OF THE PREFERRED EMBODIMENTS

Figure 1:
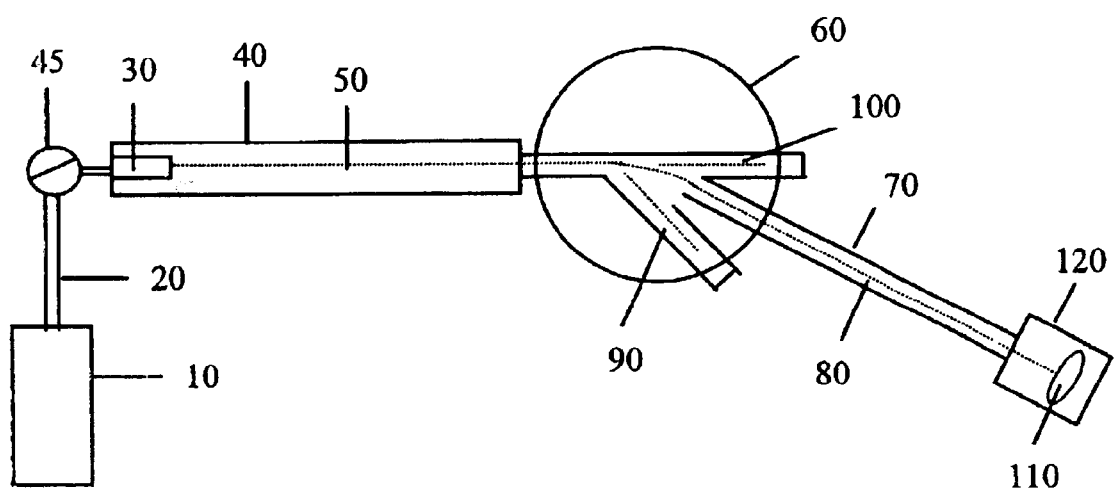
FIG. 1 shows a schematic diagram (not to scale) of a preferred ion implantation apparatus.

Chemical precursors comprised of at least one silicon atom and at least one Group III and/or Group V atom are preferably employed in the disclosed CVD and ion implantation processes. The term "Group III" refers to elements in Group III of the periodic table and thus includes B, Al, Ga, In, and Tl. The term "Group V" refers to elements in Group V of the periodic table and thus includes N, P, As, Sb and Bi. Preferred chemical precursors include $(H_3Si)_{3-x}MR_x$, $(H_3Si)_3N$, and $(H_3Si)_4N_2$, wherein R is H or D, x=0, 1 or 2, and M is selected from the group consisting of B, Al, Ga, In, P, As, and Sb. The term "dopant precursor" is used herein to refer to the group of chemical precursors that includes electrically active dopants, e.g., an element selected from the group consisting of boron, arsenic, phosphorous and antimony. The term "dopant precursor" also includes chemical precursors that comprise a nitrogen atom, in the context of making nitrogen-doped films such as nitrogen-doped SiC. Such chemical precursors may be obtained commercially or prepared by methods known to those skilled in the art.

Trisilylarsine ($(SiH_3)_3As$ and deuterated versions thereof) and trisilylphosphine ($(SiH_3)_3P$ and deuterated versions thereof) are especially preferred dopant precursors for making the alloys and doped Si-containing films described herein. Such precursors may be made by methods known to those skilled in the art, see, e.g., Examples 12 and 13 of U.S. Pat. No. 4,910,153, which is hereby incorporated be reference in its entirety and particularly for the purpose of describing the preparation of chemical precursors. Nitrogen-containing chemical precursors that are free of N—H bonds are preferred dopant sources for III–V compound semiconductor materials and for making nitrogen-doped silicon carbide (SiC) films. Examples of such preferred precursors include trisilylamine and tetrasilylhydrazine.

In some embodiments, a dopant precursor is preferably used in combination with an elemental source such as a silicon source, germanium source, oxygen source, and/or carbon source. "Elemental sources" are sources of the particular element in question. The dopant precursors disclosed herein can serve as elemental sources but, to avoid confusion, the term "elemental source" as used herein does not include compounds identified above as dopant precursors.

Examples of preferred elemental sources include silicon sources, germanium sources and carbon sources. Silicon sources are compounds that can be used in a CVD or ion implantation process as a source of silicon atoms for deposition on a substrate. Preferred silicon sources include silane, disilane and trisilane, more preferably trisilane. Germanium sources are materials that can be used in a CVD or ion implantation process as a source of germanium atoms for deposition on a substrate. Preferred germanium sources include germane, digermane and trigermane, more preferably digermane. Carbon sources are compounds that can be used in a CVD or ion implantation process as a source of carbon atoms for deposition on a substrate. Preferred carbon sources include hydrocarbons, e.g. methane, ethane, propane, butane, etc. Preferred precursor compounds serve as sources for two or more elements. For example, tetrasilylmethane, trisilylmethane, disilylmethane, silylmethane, dimethylsilane, trimethylsilane, and tetramethlysilane can serve as both carbon sources and silicon sources. In the following discussion, unless otherwise stated, it will be understood that the chemical precursor may optionally be a mixture of chemical precursors and may optionally comprise one or more elemental sources.

The amount of elemental source used in combination with one or more precursors as described herein can vary over a broad range, depending on the amount of Group III or Group V element desired in the deposited film. The dopant precursor comprises an amount of elemental source in the range from nil to 99.999999%, by weight based on the total amount of chemical precursor and elemental source. For example, if the amount of silicon, germanium, and/or carbon source is low or zero, the dopant precursor(s) may be the primary or sole source of silicon and an alloy film containing relatively large amounts of Group III or Group V elements can be prepared. On the other hand, at very high levels of silicon, germanium and/or carbon source, the dopant precursor primarily functions as a source of Group III or Group V atoms that are incorporated into the film in an amount that is effective to constitute n-type or p-type doping of the film. Carbon sources, when used, are preferably employed along with a dopant precursor and a silicon source to deposit SiC materials, preferably nitrogen-doped SiC. As used herein, "SiC", "SiN," "SiGe", "SiON," "SiGeC," etc., represent materials that contain the indicated elements in various proportions. For example, "SiC" is a material that comprises silicon, carbon and, optionally, other elements, e.g., nitrogen. "SiC", "SiN," "SiGe," "SiON," and "SiGeC" are not chemical formulas per se and thus are not limited to materials that contain particular ratios of the indicated elements.

Preferably, delivery of the dopant precursor to the substrate surface is accomplished by introducing the dopant precursor to a suitable chamber having the substrate disposed therein. By establishing deposition conditions in the chamber and supplying the dopant precursor to the substrate surface, a high quality Si-containing film can be deposited onto the substrate. Deposition may be suitably conducted according to the various deposition methods known to those skilled in the art, particularly vapor deposition methods, but the greatest benefits are obtained when deposition is conducted according to the chemical vapor deposition (CVD) methods taught herein. The disclosed methods may be suitably practiced by employing thermal CVD, atomic layer deposition ("ALD"), or plasma-enhanced CVD ("PECVD"), preferably by supplying the dopant precursor to the chamber in the form of, or as a component of, a gas, e.g. a feed gas.

Thermal CVD is preferably conducted at a substrate temperature of about 400° C. or greater, more preferably about 450° C. or greater, even more preferably about 500° C. or greater. Preferably, deposition takes place at a temperature of about 750° C. or less, more preferably about 700° C. or less, most preferably about 650° C. or less. Such temperatures are preferably achieved by heating the substrate to the indicated temperature. Those skilled in the art can adjust these temperature ranges to take into account the realities of actual manufacturing, e.g., preservation of thermal budget, deposition rate, etc. Preferred deposition temperatures thus depend on the desired application, but are typically in the range of about 400° C. to about 750° C., preferably about 450° C. to about 700° C., more preferably about 500° C. to about 650° C. The deposition temperature may affect the crystallinity of the deposited film. Depending on the application, it may be desirable to deposit an amorphous film, a film having relatively low crystallinity, a polycrystalline film, or an epitaxial film. Generally, greater crystallinity is produced at higher deposition temperatures. Epitaxy also requires a high quality crystalline surface on which to deposit.

For thermal CVD, the dopant precursor is preferably introduced to the CVD chamber in the form of a gas or as a component of a feed gas. The total pressure in the CVD chamber is preferably in the range of about 0.001 torr to about 800 torr, more preferably in the range of about 0.1 torr to about 760 torr, most preferably in the range of about 1 torr to about 100 torr. The partial pressure of the dopant precursor is preferably in the range of about 0.0001% to about 100% of the total pressure, more preferably about 0.001% to about 50% of the total pressure. The feed gas can include a gas or gases other than the dopant precursor, such as inert carrier gases. Hydrogen and nitrogen are preferred carrier gases for the methods described herein. For dopant precursors that are liquids at room temperature and pressure, the dopant precursor is preferably introduced to the chamber by way of a bubbler used with a carrier gas to entrain the dopant precursor vapor, more preferably a temperature controlled bubbler, for high targeted dopant concentrations. For low targeted dopant concentrations, the dopant precursor may advantageously be delivered as part of a pre-formed mixture with a carrier gas such as hydrogen or nitrogen. Preferably, the pre-formed mixture is contained within a source vessel, e.g., gas cylinder, prior to use. The concentration of the precursor and the pressure in the vessel are preferably selected so that the dopant precursor remains a gas. Preferred dopant precursor concentration and vessel pressure ranges can be determined through routine experimentation using methods known to those skilled in the art.

A suitable manifold may be used to supply feed gas(es) to the CVD chamber. In a preferred embodiment, the gas flow in the CVD chamber is horizontal, most preferably the chamber is a single-wafer, horizontal gas flow reactor, preferably radiatively heated. Suitable reactors of this type are commercially available, and preferred models include the Epsilon™ series of single wafer reactors commercially available from ASM America, Inc. of Phoenix, Ariz. While the methods described herein can also be employed in alternative reactors, such as a showerhead arrangement, benefits in increased uniformity and deposition rates have been found particularly effective in the horizontal, single-pass laminar gas flow arrangement of the Epsilon™ chambers, employing a rotating substrate, particularly with low process gas residence times (e.g., less than about 100 seconds) within the chamber during processing.

For PECVD, suitable deposition conditions can be created by coupling energy to a gas mixture including a dopant precursor in order to ionize the dopant precursor and create radicals. A preferred plasma can be generated by applying high- or low-radio frequency power to the dopant precursor. The plasma may be generated remotely, e.g., outside of the CVD chamber, then the activated atoms and/or molecules can be introduced to the CVD chamber, or the activated atoms and/or molecules can be introduced to the chamber by generating the plasma within the chamber. In a preferred embodiment, an in situ plasma is created within the deposition chamber in the presence of the dopant precursor. A preferred PECVD chamber is an Eagle-10™ reactor, available commercially from ASM Japan K.K., of Tokyo, Japan. Preferred power levels may range up to about 5 kW.

PECVD is preferably conducted at a substrate temperature of about 0° C. or greater, more preferably about 50° C. or greater, even more preferably about 100° C. or greater. Preferably, such deposition takes place at a temperature of about 650° C. or less, more preferably about 550° C. or less, most preferably about 450° C. or less. As in the thermal CVD techniques discussed above, preferred deposition temperatures depend on the desired application. Typical PECVD deposition temperatures are in the range of about 0° C. to about 650° C., preferably about 50° C. to about 550° C., more preferably about 100° C. to about 450° C.

In the preferred in situ plasma embodiment, the dopant precursor is preferably introduced to the PECVD chamber in the form of a gas or as a component of a feed gas, using a suitable manifold and/or bubbler where appropriate. The total pressure in the PECVD chamber is preferably in the range of about 0.1 torr to about 10 torr, more preferably in the range of about 0.5 torr to about 8 torr, most preferably in the range of about 1 torr to about 5 torr. The partial pressure of the dopant precursor is preferably in the range of about 0.0001% to about 100% of the total pressure, more preferably about 0.001% to about 50% of the total pressure. The feed gas can include a gas or gases other than the dopant precursor, such as inert carrier gases. Helium and argon are preferred carrier gases for PECVD.

Atomic layer deposition (ALD) may also be used to deposit Si-containing films using chemical precursors described herein. ALD, as used herein, refers to a process in which very thin layers are deposited sequentially on a surface. ALD generally proceeds differently from conventional CVD techniques. In conventional CVD, when two or more reactant gases are introduced to the deposition chamber, they react together on the substrate and form a deposit on the substrate surface. In ALD, the reactant gases are introduced one at a time, without substantial mixing in the gas phase. Films deposited by ALD are built up in cycles by introducing short, alternating pulses of each reactant. The pulses may optionally comprise inert gases e.g. carrier gases such as helium, hydrogen, argon and/or nitrogen. Such inert gases also preferably serve to aid removal of reactants between pulses by purging.

In ALD, the first reactant chemisorbs on the substrate to form no more than one monolayer of chemisorbed species.

As used herein, "chemisorb" and "chemisorption" refer to a chemical adsorption process in which chemical bonds are formed between gas or liquid molecules and a surface. Under the ALD conditions, the first reactant absorbs on the substrate, but does not react with itself, so the chemisorbed species form no more than a monolayer because they are incapable of undergoing further reaction with the first reactant. To this end, temperatures are desirably maintained in the temperature window described below. Any excess of the first reactant that is not chemisorbed is typically purged or evacuated. A second reactant is then introduced which reacts with the first monolayer or partial monolayer formed during the previous pulse. Since the second reactant reacts with the chemisorbed species in the first monolayer, but not with itself, it is also self-limiting in effect. This self-limiting, layer-by-layer process is continued in a like manner by introducing alternating pulses of the first and second reactant until a film having the desired thickness is obtained. Three or more reactant pulses can also be employed in an ALD cycle.

In a preferred embodiment, ALD is conducted by alternately introducing a dopant precursor and a second reactant, each optionally in the presence of a carrier gas. The dopant precursor is provided in the absence of the second reactant. Preferred dopant precursors include trisilylarsine, trisilylphosphine, trisilylamine, and tetrasilylhydrazine, most preferably trisilylamine. A preferred second reactant is an oxygen source, more preferably water, water vapor, or ozone. Deposition temperatures are preferably selected to be above the condensation temperatures and below the thermal decomposition temperatures of the reactants used. Preferably, temperatures are in the range of about 50° C. to about 350° C., more preferably about 65° C. to about 300° C. Preferably, films deposited by ALD are non-hydrogenated. ALD is preferably conducted using commercially available equipment. Particularly preferred tools for these purposes are the line of Atomic Layer CVD™ equipment available commercially from ASM International N.V., Bilthoven, the Netherlands. The Pulsar 2000™ reactor is particularly designed for single wafer ALD processing.

Films formed by CVD are preferably amorphous or crystalline films that contain silicon and a Group III or Group V element. Preferred examples include doped amorphous silicon films, doped crystalline silicon films, nitrogen-doped SiC, and alloys of silicon with electrically active dopants such as As, P, B and Sb. As used herein, the term "crystalline" includes polycrystalline and single crystal types of crystalline morphology. An epitaxial layer is a deposited layer in which the crystalline structure matches that of the underlying substrate. The chemical composition of the resulting Si-containing film is preferably controlled by controlling the partial pressures of the dopant precursor and elemental source (if any) through routine experimentation. The relative amounts of silicon, Group III or Group V element, and any additional elements in the resulting film generally reflect the composition and amounts of the chemical precursor(s) and elemental sources used to deposit the film, as well as deposition conditions. Thus, the relative amounts of the various elements can be varied over a broad range by selecting the appropriate amount of dopant precursor and, optionally, elemental source for a given set of deposition conditions. For example, towards one end of the range, an alloy film having a relatively high concentration of Group III or Group V element can be deposited using little or no elemental source and a dopant precursor containing a relatively low level of silicon, such as $H_3SiAsH_2$. Towards the other end of the range, a lightly doped film containing parts per billion (ppb) levels of Group III of Group V element can be deposited using relatively low levels of dopant precursor and relatively large amounts of silicon and/or germanium sources.

The thickness of the deposited films may be varied over a broad range as desired, depending on the specific application, by controlling the feed rate of the reactants and the deposition time and temperature. Generally, thicker films are obtained at higher feed rates and temperatures, and at longer deposition times. Preferred film thicknesses are in the range of about 10 Å to about 10,000 Å, depending on the desired application.

Advantageously, the precursors described herein facilitate deposition with low hydrogen contamination under selected conditions. Accordingly, a preferred embodiment provides a CVD process for making a non-hydrogenated Si-containing film. Hydrogenated films generally contain 10 atomic % or more of hydrogen. Films containing less than 10 atomic % hydrogen are considered non-hydrogenated for purposed of the present disclosure. Preferably, the film formed by the CVD process contains about 5 atomic % hydrogen or less, more preferably about 2 atomic % hydrogen or less. Hydrogenation is favored at low deposition temperatures, so thermal CVD is preferably conducted at a deposition temperature high enough to produce non-hydrogenated films. More preferably, thermal CVD is conducted at a temperature in the range of about 425° C. to about 700° C., most preferably about 450° C. to about 650° C. Examples of the resulting non-hydrogenated Si-containing films include doped amorphous silicon, doped polysilicon, doped epitaxial silicon, doped silicon carbide (SiC), doped silicon germanium (SiGe), and doped silicon germanium carbon (SiGeC).

Thermal CVD is particularly preferred for the deposition of SiN using dopant precursors such as trisilylamine and tetrasilylhydrazine, because the presence of hydrogen-containing molecules during PEVCD tends to result in hydrogenated films. PECVD can also be employed, however, to achieve non-hydrogenated films if higher temperatures than conventional PECVD are employed. Deposition of non-hydrogenated Si-containing films using PECVD is preferably conducted by heating the substrate to a temperature in the range of about 550° C. to about 700° C.

Thermal CVD is also preferred for the deposition of non-hydrogenated SiC films. A particularly preferred thermal CVD process produces a nitrogen-doped SiC film using a small amount of a nitrogen-containing dopant precursor, preferably trisilylamine and/or tetrasilylhydrazine, along with a silicon source, preferably trisilane, and a carbon source, preferably tetrasilylmethane. The amounts of nitrogen-containing dopant precursor, silicon source and carbon source are preferably chosen to be effective to provide a SiC material having a nitrogen level in the range of about 100 ppm to about 10,000 ppm. Such films are particularly useful in integrated circuits as diffusion barriers and etch stop layers.

The CVD processes for making non-hydrogenated Si-containing films preferably utilize a dopant precursor having the formula $(H_3Si)_{3-x}MR_x$, wherein R is H or D, x=0, 1 or 2, and M is selected from the group consisting of B, Al, Ga, In, P, As, and Sb. Specific examples of preferred dopant precursors include trisilylarsine and trisilylphosphine. The reactant gases preferably further comprise a silicon source, more preferably silane, disilane or trisilane. Optionally, the reactant gases may further comprise a germanium source, preferably digermane, and/or a carbon source, preferably tetrasilylmethane. In one embodiment, the non-hydrogenated Si-containing film comprises an alloy, preferably comprising about 50 atomic % to about 99.9 atomic % Si and the remainder arsenic or phosphorous. In another embodiment, the non-hydrogenated Si-containing film comprises a doped Si-containing film, preferably comprising an amount of arsenic or phosphorous in the range of about 1 part per billion (ppb) to about 1,000 parts per million (ppm, 0.1 atomic %).

In another preferred embodiment, a CVD process is provided for making a Si-containing film that is at least partially crystalline by using a silicon source and a dopant precursor. Crystallinity can be obtained in various ways. For example, the film can be deposited, preferably by thermal CVD, at a temperature that is effective to produce at least partial crystallinity, preferably in the range of about 550° C. to about 700° C. The resulting film can be polycrystalline or single crystal, depending largely on the quality of the underlying surface. In the alternative, crystallinity can be obtained by first depositing an amorphous film and then heating in a separate anneal to at least partially crystallize the film. Amorphous films may be deposited by thermal CVD, preferably at a temperature in the range of about 450° to about 600° C., or by PECVD. Thermal CVD is preferred to drive hydrogen out of the film when depositing non-hydrogenated amorphous films. Preferably, the amorphous film is heated to a temperature and for a period of time that is effective to produce crystallinity, more preferably to a temperature in the range of about 550° C. to about 700° C. for a period of time in the range of from about 2 minutes to about 1 hour. The resulting film after annealing is typically polycrystalline.

Preferred silicon sources for use in forming the crystalline film include silane, disilane and, more preferably, trisilane. Preferred dopant precursors include precursors of the formula $(H_3Si)_{3-x}MR_x$, where R is H or D, x=0, 1 or 2, and M is an electrical dopant atom selected from the group consisting of P, As, B, and Sb. Trisilylarsine and trisilylphosphine are examples of such preferred dopant precursors. The dopant precursor and silicon source are preferably introduced to the chamber in amounts effective to result in the deposition of a Si-containing film comprising an amount of dopant, preferably arsenic or phosphorous, in the range of about 1 ppb to about 1,000 parts ppm, more preferably about 100 ppb to about 100 ppm. Other elemental sources, e.g., germanium sources and/or carbon sources, can also be introduced to the chamber during deposition to thereby incorporate those elements into the resulting film.

Doped crystalline Si-containing films formed by the CVD processes described herein are useful in a number of microelectronics applications, e.g., base structures for transistors. In preferred embodiments, such films typically contain from about 60 atomic % to about 99.9999999 atomic % silicon, from 0% to about 40 atomic % germanium, and from about 1 ppb to about 1 atomic % of a dopant selected from the group consisting of arsenic, boron, indium, phosphorous and antimony, but higher or lower concentrations are sometimes used depending upon the application. Such films are deposited by the CVD methods described herein using a silicon source, preferably selected from the group consisting of silicon hydrides (e.g., silane, disilane and trisilane), more preferably trisilane; an optional germanium source selected from the group consisting of germane, digermane and trigermane, preferably digermane; and a dopant precursor selected from the group consisting of trisilylarsine, trisilylphosphine, and trisilylstibine. The relative amounts of silicon source, germanium source, and dopant precursor depend on the specific composition desired in the resulting film and may be determined by routine experimentation.

Doped Si-containing films formed by the CVD processes described herein are useful as solid diffusion sources. In preferred embodiments, such films contain from about 50 atomic % to about 99.9999 atomic % silicon and from about 1 ppm to about 50 atomic %, preferably about 1 atomic % to about 35 atomic %, of a dopant selected from the group consisting of arsenic, boron, indium, phosphorous and antimony. Such films are preferably deposited by the CVD methods described herein using a silicon source selected from the group consisting of silane, disilane, and trisilane, preferably trisilane; and a dopant precursor selected from the group consisting of trisilylarsine, trisilylphosphine, and silylstibine. The relative amounts of silicon source and dopant precursor depend on the specific composition desired in the resulting solid diffusion source and may be determined by routine experimentation.

Solid diffusion sources can be advantageously formed by the CVD processes described herein with relatively high levels of dopants that are more uniformly distributed throughout the source, without the disadvantages associated with such high dopant levels in films formed by conventional precursors. In situ doped films using conventional precursors are difficult to controllably deposit. Preferred solid diffusion sources are thin, more preferably having a thickness in the range of about 50 Å to about 100 Å. Uniform dopant distribution in such thin films is particularly advantageous. Continuity of the film further ensures uniform doping of the structure to be doped by diffusion from the solid source film.

A preferred embodiment provides an ion implantation process for making a doped Si-containing film. A schematic diagram of an exemplary ion implantation system is shown in FIG. 1. With reference to FIG. 1, in a preferred embodiment a dopant precursor as described herein is contained in a vessel 10 connected by a feed line 20 to an ionization chamber 30 situated near the upstream end of an evacuated ion acceleration chamber 40. The flow of dopant precursor from the vessel 10 via the feed line 20 can be controlled by a manifold 45, preferably equipped with a valve, more preferably equipped with a mass flow controller. The vessel 10 may contain the dopant precursor in a concentrated form or diluted with a carrier gas such as helium, or in admixture with other chemical precursors. FIG. 1 shows a single vessel 10, but additional vessels can be used to contain the carrier gases and/or other chemical precursors. Each additional vessel may be connected to a common feed line or via separate manifolds to the ionization chamber.

The dopant precursor is ionized in the ionization chamber 30 to form various dopant excited species, e.g., dopant ions and/or molecular fragments, of differing masses by applying electromagnetic energy, e.g., radio frequency energy, to the gas. These species are accelerated through the chamber 40 along the general path shown in FIG. 1 by the dotted line 50 into an evacuated mass separation chamber 60. The chamber 60 is preferably equipped with an analyzing magnet (not shown) that separates the species from one another based on mass. By varying the strength of the magnetic field of the analyzing magnet, a sub-population of dopant excited species having the desired mass are selected and directed down into an evacuated chamber 70 attached to the chamber 60 along the path generally indicated in FIG. 1 by the dotted line 80. The remaining species not having the desired mass are not selected and do not form part of the sub-population, and their paths are indicated generally by the dotted lines 90 and 100 in FIG. 1. A Si-containing film on a substrate 110 contained within the chamber 120 attached to the end of the chamber 70 is doped using ion implantation by exposing it to the mass-selected dopant excited species that exit the chamber 70.

Another ion implantation process applicable to the preferred dopant precursors is plasma immersion ion implantation ("PIII"), also known as plasma source ion implantation ("PSII"). This technique is known to those skilled in the art, see, e.g., U.S. Pat. Nos. 6,186,091; 6,051,073; and 5,653,811, all of which are incorporated herein by reference and expressly for the purpose of describing PIII processes. PIII tools and application technology differ from that shown in FIG. 1, but are commercially available from Silicon Genesis Corporation, Campbell, Calif. PIII tools can be used to implant dopant atoms into Si-containing films by supplying the tool with a source of dopant precursor in accordance with the operating instructions for the particular tool.

The Si-containing film that is doped by ion implantation is preferably an amorphous silicon film, a crystalline silicon film (single crystal or polycrystalline), a SiN film or a SiC film. Preferred chemical precursors are selected from the group consisting of $(H_3Si)_{3-x}MR_x$, $(H_3Si)_3N$, and $(H_3Si)_4N_2$, wherein R is H or D, x=0, 1 or 2, and M is selected from the group consisting of B, Al, Ga, In, P, As, and Sb. Examples of preferred dopant precursors include trisilylarsine, trisilylphosphine, trisilylamine, and tetrasilylhydrazine. The resulting doped Si-containing film preferably comprises an amount of dopant atom, preferably arsenic or phosphorous, in the range of about 1 part per billion to about 1,000 parts per million, more preferably about 100 ppb to about 100 ppm. The amount of dopant can be controlled through routine experimentation by varying the implantation time and the rate at which the dopant precursor is supplied to the system.

The process of implanting dopant ions into a single crystal Si-containing film may damage the crystal structure, see Peter Van Zant, "Microchip Fabrication," 4$^{th}$ Ed., McGraw Hill, N.Y., (2000), pp. 349–351. The crystal damage can be repaired by annealing the doped Si-containing film at a temperature and for a period of time effective to repair the damage. The temperature should be selected to facilitate repair in a reasonable amount of time while minimizing unwanted diffusion of the dopant. Preferably, annealing is conducted at a temperature in the range of about 100° C. to about 700° C., more preferably about 300° C. to about 650° C., for a period of time in the range of about 2 minutes to about 1 hour.

The use of the dopant precursors as described herein provides an improved method for making p-type and n-type silicon-based materials, and, as a direct result, an improved method for manufacturing silicon-based semiconductor devices. For instance, the use of these precursors can provide a number of advantages for ion implantation of Group III and Group V elements. Higher mass fragments may be generated that contain both the dopant atom to be implanted and silicon, without any unwanted elements, as compared to $PH^{2+}$, $PH_2^+$, $AsH^{2+}$, $AsH_2^+$, etc. This can enable the selection of fragments with higher mass with improved resolution relative to the hydride dopant sources commonly employed. The additional silicon atoms implanted in the surfaces can provide a benefit by enabling lower annealing temperatures and/or shorter annealing times for repair of implant damage. In high enough concentration, the additional silicon atoms can also help to prevent channeling of the ion beam within the crystalline lattice of single crystal silicon-based materials that are to be implanted. The higher mass of the species to be implanted can also allow for better control of the dopant profile in the implanted material.

Also, the use of the dopant precursors as described herein preferably provides a number of advantages for the in situ doping of silicon-based materials by CVD methods. For instance, dopants are incorporated with high efficiency within silicon-based materials, particularly at low deposition temperatures, as compared to the use of $AsH_3$, $PH_3$, etc. Such high dopant levels can be obtained controllably in thin, uniform films, due in part to silicon-dopant bonds within the dopant precursor.

Preferably, use of the dopant precursors described herein also results in reduced segregation of dopant atoms to grain boundaries in polycrystalline silicon-based materials, relative to conventional dopant precursors. Increased deposition rates for doped polycrystalline materials, relative to hydride dopant source chemicals can be obtained, particularly at low deposition temperatures. Likewise, the preferred precursors obtain a higher percentage of electrically active dopant species in as-deposited silicon-based materials relative to hydride source chemicals, particularly at low deposition temperatures. Also, the preferred precursors permit improved control over the distribution of dopant atoms following subsequent p-n junction formation, due to a higher percentage of substitutionally incorporated dopant atoms and reduced dopant atom concentration along grain boundaries. Higher total dopant concentrations in single crystal and polycrystalline materials are preferably achieved due to the chemical properties of the dopant precursors (e.g., higher total solubility), particularly at low deposition temperatures. Preferred dopant precursors include only elements to be deposited (namely silicon and a dopant) and hydrogen, which is preferably eliminated during the deposition process. Use of preferred dopant precursors can also provide increased decomposition efficiency relative to halide sources, particularly at low deposition temperatures. Improved as-deposited dopant uniformity results, inter alia, from the high reactivity and low surface mobility of the preferred dopant precursors relative to the hydride sources, particularly at low deposition temperatures. The molecular structure of the dopant precursors may also help to alleviate stress on a localized level within the resulting doped Si-containing materials in addition to providing the desired electrical properties.

With respect to nitrogen doping, trisilylamine and tetrasilylhydrazine are advantageously free of N—H bonds that are difficult to eliminate at low deposition temperatures and the Si atoms present in the dopant precursors may also facilitate higher growth rates for low temperature SiC. Use of trisilylamine and/or tetrasilylhydrazine as nitrogen sources for CVD deposition of SiC deposited at low temperatures may provide an advantage over current doping techniques that require the use of ion implantation, molecular nitrogen or ammonia by providing alternative ways to incorporate nitrogen atoms into SiC.

EXAMPLES 1–3

A tube furnace having an inlet and outlet was equipped with a pre-mix chamber and mass flow controller. Three Si<100> substrates were placed along the length of the furnace. The furnace was evacuated and heated to a temperature of about 575° C. Trisilylphosphine gas was introduced into the furnace at a flow rate of about 5–10 standard cubic centimeters per minute ("sccm") and a pressure of about 0.001 torr, and continued for about 15 minutes. The trisilylphosphine flowed along the length of the furnace to the outlet, thereby depositing Si-containing films on each of the three substrates. The substrate of Example 1 was closest to the inlet and the substrate of Example 3 was closest to the outlet.

All three films were polycrystalline and had a thickness in the range of about 500 Å to about 1000 Å. The approximate composition (±1 atomic %) of each of the deposited films was measured by Rutherford backscattering spectroscopy ("RBS"). Hydrogen concentration was measured using RBS elastic recoil detection ("ERD") and confirmed qualitatively by Fourier-transform infrared spectroscopy ("FTIR"). The results are shown below in Table 1. No oxygen or hydrogen was detected in any of the films. These examples demonstrate the deposition of non-hydrogenated Si-containing films by thermal CVD using trisilylphosphine.

TABLE 1

| Example No. | Si | P |
|---|---|---|
| 1 | 68 | 32 |
| 2 | 80 | 20 |
| 3 | 89 | 11 |

EXAMPLE 4

A Si<100> wafer substrate is etched in a solution of dilute hydrofluoric acid, rinsed and dried, then loaded into an Epsilon E2500™ reactor system (available commercially from ASM America, Inc. of Phoenix, Ariz.) and subjected to a hydrogen bake at 900° C. at atmospheric pressure under a flow of 80 standard liters per minute (slm) of ultra-pure hydrogen for 2 minutes. The substrate is then allowed to reach thermal equilibrium at 600° C. at 40 Torr pressure under a flow of 20 slm of ultra-pure hydrogen gas. The steps of etching, drying, rinsing, and baking render the single crystal surface active for epitaxial film growth.

Pure hydrogen gas is then passed through a liquid mixture of 99.999 weight % trisilane and 0.001 weight % trisilylarsine in order to deliver a vapor comprising trisilane and trisilylarsine to the heated substrate. The liquid mixture is maintained at room temperature using a water bath around the bubbler containing the mixture. The vapor is introduced into the reactor at a flow rate of 90 sccm for 2 minutes. A high crystal quality, arsenic-doped epitaxial silicon film having a thickness of about 180 Å is deposited on the Si <100> substrate. No hydrogen is detected in the film by RBS using ERD. This example illustrates the deposition of a non-hydrogenated crystalline doped Si-containing film by thermal CVD using a preferred silicon source (trisilane) and a preferred dopant precursor (trisilylarsine).

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

I claim:

1. An ion implantation process for making a doped Si-containing film, comprising:
   providing a Si-containing film on a substrate;
   providing an ionization chamber upstream of the substrate;
   introducing a dopant precursor to the ionization chamber, wherein the dopant precursor comprises at least one silicon atom and at least one Group III or Group V atom;
   ionizing at least a portion of the dopant precursor to form dopant excited species by applying electromagnetic energy to the dopant precursor;

applying a magnetic field to the dopant excited species to create a sub-population of mass-selected dopant excited species; and directing at least a portion of the sub-population of mass-selected dopant excited species onto the Si-containing film to produce the doped Si-containing film.

2. The process of claim 1, wherein the Si-containing film is a crystalline film.

3. The process of claim 2, wherein the crystalline film is a silicon carbide film and the dopant precursor is selected from the group consisting of $(H_3Si)_3N$ and $(H_3Si)_4N_2$.

4. The process of claim 1, wherein the dopant precursor is selected from the group consisting of $(H_3Si)_{3-x}MR_x$, $(H_3Si)_3N$, and $(H_3Si)_4N_2$, wherein R is hydrogen or deuterium, x=0, 1 or 2, and M is selected from the group consisting of boron, phosphorous, arsenic and antimony.

5. The process of claim 4, wherein the dopant precursor is selected from the group consisting of trisilylarsine and trisilyiphosphine.

6. The process of claim 4, wherein the dopant precursor is $(H_3Si)_3N$.

7. The process of claim 1, further comprising heating the doped Si-containing film to a temperature in the range of about 100° C. to about 700° C.

8. A method for making a doped Si-containing film, comprising:

providing a Si-containing film;

forming a plasma from a gas comprising a dopant precursor selected from the group consisting of $(H_3Si)_{3-x}MR_x$, $(H_3Si)_3N$, and $(H_3Si)_4N_2$, wherein hydrogen or deuterium, x=0, 1 or 2, and M is selected from the group consisting of boron, phosphorous, arsenic and antimony; and implanting active species of the dopant precursor from the plasma into the Si-containing film by ion implantation.

9. The process of claim 8, wherein the dopant precursor is selected from the group consisting of trisilylarsine and trisilylphosphine.

10. The process of claim 8, wherein implanting comprises a mass selection process.

11. The process of claim 8, wherein implanting comprises plasma immersion.

* * * * *